United States Patent [19]

Kato et al.

[11] Patent Number: 5,552,255
[45] Date of Patent: Sep. 3, 1996

[54] ARTICLE UTILIZING QUINONE DIAZIDE RESIST LAYER ON TANTALUM SUBSTRATE SURFACE

[75] Inventors: Tetsuya Kato, Fujisawa; Kouichi Takahashi, Sagamihara; Hidekatsu Kohara, Chigasaki; Toshimasa Nakayama, Hiratsuka, all of Japan

[73] Assignee: Tokyo Ohka Kogyo Co., Ltd., Kanagawa-ken, Japan

[21] Appl. No.: 344,342

[22] Filed: Nov. 22, 1994

Related U.S. Application Data

[62] Division of Ser. No. 230,883, Apr. 20, 1994, Pat. No. 5,401,617, which is a continuation of Ser. No. 46,239, Apr. 13, 1993, abandoned.

[30] Foreign Application Priority Data

Apr. 14, 1992 [JP] Japan ..................................... 4-119568

[51] Int. Cl.$^6$ ......................................................... G03F 7/09
[52] U.S. Cl. ........................... 430/165; 430/166; 430/191; 430/275.1

[58] Field of Search ..................... 430/191, 165, 430/326, 275, 275.1, 166

[56] References Cited

U.S. PATENT DOCUMENTS 4,626,492  12/1986  Eilbeck .................................. 430/191
5,077,173  12/1991  Schulz et al. ......................... 430/191

*Primary Examiner*—Charles L. Bowers, Jr.
*Assistant Examiner*—Christopher G. Young

[57] ABSTRACT

Proposed is an alkali-soluble, positive-working photo-sensitive resin composition which can be used as a material for forming a finely patterned resist layer on the surface of a metallic substrate such as tantalum to exhibit excellent adhesion of the patterned resist layer to the substrate surface. The composition comprises, in addition to a novolac resin as a film-forming agent and a naphthoquinone diazide group-containing compound as a photosensitizer, an aromatic compound having two benzene rings and at least five phenolic hydroxy groups in a molecule such as pentahydroxy and hexahydroxy benzophenone compounds as an adhesion improver.

5 Claims, No Drawings

ARTICLE UTILIZING QUINONE DIAZIDE RESIST LAYER ON TANTALUM SUBSTRATE SURFACE

This application is a divisional application of application Ser. No. 08/230,883 filed: Apr. 20, 1994, U.S. Pat. No. 5,401,617, which application is a continuation of Ser. No. 08/046,239, filed Apr. 13, 1993, now abandoned.

BACKGROUND OF THE INVENTION

The present invention relates to a method for forming a patterned resist layer on a metallic substrate surface or, more particularly, to a method for forming a patterned resist layer on the surface of a substrate of which at least the surface layer is made from a metal such as tantalum with greatly improved adhesion between the resist layer and the metallic surface.

It is a well established technology in the manufacture of various kinds of semiconductor devices such as ICs and LSIs and liquid crystal display units that the surface of a metallic substrate of aluminum, tantalum, molybdenum, chromium and the like is finely worked by the etching method in which a thin layer of a photosensitive resin composition is formed on the substrate surface as a resist layer which is patterned by the photolithographic process by first exposing the resist layer pattern-wise to actinic rays such as ultraviolet light through a patterned photomask to form a latent image which is developed with a developer solution to give a patterned resist layer to be used as a resist in the etching of the metallic substrate surface with an etching solution. Various types of photosensitive resin compositions are known in the prior art to be suitable for the above mentioned purpose, of which those quite satisfactory include positive-working photosensitive resin compositions comprising an alkali-soluble novolac resin as a film-forming ingredient and a quinone diazide group-containing organic compound or, in particular, a quinone diazide group-containing benzophenone compound as a photosensitive ingredient (see, for example, U.S. Pat. No. 4,377,631 and Japanese Patent Kokai 62-35349, 1-142548 and 1-179147).

In the photolithographic etching process of a metallic substrate surface in the manufacture of semiconductor devices and liquid crystal display units, one of the requirements for the photoresist composition is that the adhesion between the patterned resist layer and the metallic substrate surface is very firm while none of the photosensitive resin compositions of the above mentioned type is quite satisfactory in this regard, especially, when the substrate has a surface of tantalum although these resist compositions can exhibit good adhesion to the surface of a substrate such as a semiconductor silicon wafer. Accordingly, it is eagerly desired to develop a method for forming a patterned resist layer capable of exhibiting excellent adhesion to the substrate surface even when the substrate has a metallic surface.

Various proposals and attempts have been made in order to improve adhesion between a photoresist layer and a substrate surface. For example, Japanese Patent Kokai 62-180357 teaches admixture of a photopolymerizable monomeric composition with a benzimidazole compound as an adhesion improver. Although this method is effective when the substrate is a silicon wafer, no particular improvement can be obtained in the adhesion of the resist layer when the substrate has a metallic surface or, in particular, surface of tantalum.

SUMMARY OF THE INVENTION

The present invention accordingly has an object to provide a novel method for forming a patterned resist layer capable of exhibiting excellent adhesion to the substrate surface even when the substrate has a metallic surface for example, tantalum.

The method of the present invention for forming a patterned resist layer on a metallic substrate surface of tantalum comprises the steps (A) coating the substrate surface with a positive-working photosensitive resin composition comprising, as a uniform blend,
  (a) an alkali-soluble novolac resin;
  (b) a quinone diazide group-containing organic compound; and
  (c) a polyhydroxy aromatic compound having two benzene rings in a molecule selected from the group consisting of
    (c-1) the compounds represented by the general formula

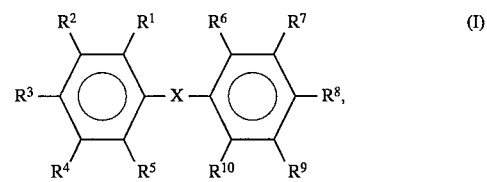

in which $R^1$ to $R^{10}$ are each, independently from the others, a hydrogen atom, alkyl group having 1 to 4 carbon atoms, alkenyl group, halogen atom, hydroxy group, alkoxy group or carboxyl group including at least five hydroxy groups and X is a divalent atom or group of the formula —CO—O—, —CO—, —S—, —SO—, —SO$_2$—, —O— or —CR$_2$—, each R being an alkyl group,
    (c-2) a compound expressed by the structural formula

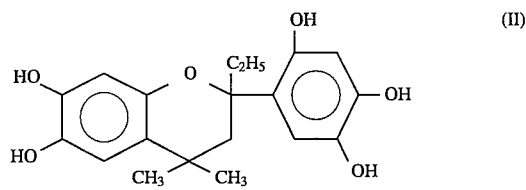

and (c-3) a compound expressed by the structural formula

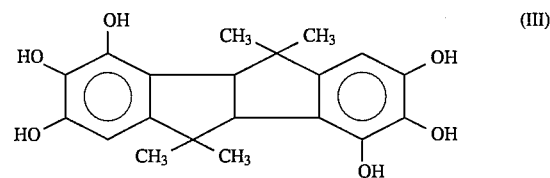

to form a resist layer;
(B) exposing the resist layer pattern-wise to actinic rays to form a latent image in the resist layer; and
(C) developing the latent image in the resist layer with an aqueous alkaline solution.

DETAILED DESCRIPTION OF THE PREFERRED EMBODIMENTS

As is described above, the most characteristic feature in the inventive method for forming a patterned resist layer on a metallic substrate surface consists in the use of the very specific positive-working alkali-soluble photosensitive resin composition comprising the components (a), (b) and (c), of which the component (a) is a film-forming ingredient, the component (b) serves as a photosensitizer and the component (c) serves to improve the adhesion between the resist layer and the metallic substrate surface. Such a photosensitive resin composition, of which the component (c) is a compound belonging to the class (c-1), is not new and disclosed in Japanese Patent Kokai 64-44439 teaching that the composition can give a resist layer having improved photosensitivity and developability on a semiconductor silicon wafer although no particular examples are given for the use of a polyhydroxy aromatic compound as the component (c) having more than two phenolic hydroxy groups in a molecule.

The component (a) in the photosensitive resin composition used in the inventive method is an alkali-soluble novolac resin which serves as a film-forming ingredient. The novolac resin is not particularly limitative and can be freely selected from the alkali-soluble novolac resins conventionally used as a film-forming ingredient in positive-working photo-resist compositions in the prior art. Such an alkali-soluble novolac resin is prepared by the condensation reaction of a phenolic compound such as phenol, cresol, xylenol and the like and an aldehyde compound such as formaldehyde in the presence of an acidic catalyst.

The component (b) in the positive-working photosensitive resin composition used in the inventive method is a quinone diazide group-containing compound which serves as a photosensitizing ingredient. Examples of preferable quinone diazide group-containing compounds include full or partial esterification products of a polyhydroxy benzophenone such as 2,3,4 -trihydroxy benzophenone, 2,3,4,4'-tetrahydroxy benzophenone and the like and naphtoquinone-1,2-diazide 5- or 4-sulfonic acid. Other quinonediazide group-containing compounds suitable as the component (b) in the composition used in the inventive method include orthobenzoquinone diazide, orthonaphtoquinone diazide, orthoanthraquinone diazide, sulfonic acid esters of orthobenzoquinone diazide, orthonaphthoquinone diazide, orthoanthraquinone diazide and the like and reaction products of orthoquinone diazide sulfonyl chloride and a compound having a hydroxy or amino group such as phenol, 4-methoxy phenol, dimethyl phenol, hydroquinone, bisphenol A, naphthol, pyrocatechol, pyrogallol, pyrogallol monomethyl ether, pyrogallol 1,3-dimethyl ether, gallic acid, partially esterified or etherified gallic acid, aniline, 4-amino diphenyl amine and the like. These compounds can be used either singly or as a combination of two kinds or more according to need as the component (b) in the photosensitive composition.

Typically, the quinone diazide group-containing compound can be prepared by the condensation reaction of the above mentioned polyhydroxy benzophenone compound with naphthoquinone diazide 5- or 4-sulfonyl chloride in a suitable solvent such as dioxane and the like in the presence of a basic compound as an acid acceptor such as triethanol amine, triethyl amine, alkali carbonates, alkali hydrogen carbonates and the like to give a full or partial esterification product.

The most characteristic ingredient in the photosensitive resin composition used in the inventive method is the component (c) which is an aromatic compound having two benzene rings in a molecule and having at least five phenolic hydroxy groups. Such an aromatic compound is selected from the group consisting of the compounds belonging to the classes of (c-1), (c-2) and (c-3) defined above. The aromatic compound belonging to the class (c-1) is represented by the general formula

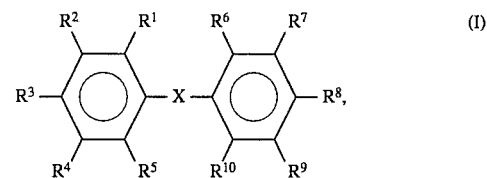

in which $R^1$ to $R^{10}$ are each, independently from the others, a hydrogen atom, alkyl group having 1 to 4 carbon atoms, alkenyl group, halogen atom, hydroxy group, alkoxy group or carboxyl group including at least five hydroxy groups and X is a divalent atom or group of the formula —CO—O—, —CO—, —S—, —SO—, —SO$_2$—, —O— and —CR$_2$—, each R being an alkyl group. The compounds belonging to the classes (c-2) and (c-3) are expressed by the structural formulas

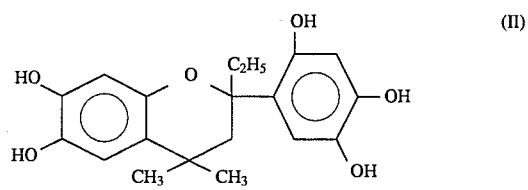

and

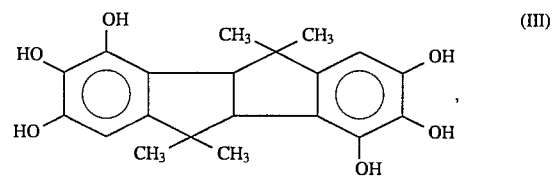

respectively.

Particular examples of the aromatic compounds represented by the above given general formula (I) include: 2,2',3,4,4'-, 2',3,4,5,6'-, 2',3,4,4',5-, 2',3,3',4,5,-, 3,3',4,4',5-, 2',3,4,5,5'- and 2',3,4,4',5'-pentahydroxy benzophenones, 2',3,4,4',5-pentahydroxy-3'-, 2',3,4,5,6'-pentahydroxy-4'-, 2',3,4,4',5-pentahydroxy-6'-, 2',3,3',4,5-pentahydroxy-6'-, 3,3',4,5-pentahydroxy-5'- and 3,3',4,4',5-pentahydroxy-6-methylbenzophenones, 2,2',3,4,4',5'-, 2',3,3',4,5,6'-, 3,4,4',5,5'-, 2',3,4,4',5,6'- and 2',3,3',4,4',5 -hexahydroxy benzophenones, 2-(2,3,4-trihydroxyphenyl)-2-(2',4'-dihydroxyphenyl) propane, 2-(2,3,4-trihydroxyphenyl)-2-(2',4',5'-trihydroxyphenyl) propane, 2-(2,3,4-trihydroxyphenyl)-2-(2',3',4'-trihydroxyphenyl) propane, 2,2',3,4,4'-phentahydroxy and 2,2',3,4,4',5'-hexahydroxy diphenylsulfides, 2,2',3,3',4,4'-hexahydroxyphenyl benzoate, 2,2',3,4,4'-pentahydroxy diphenylsulfoxide, 2',3,4,5,6'-pentahydroxy diphenylsulfone, 2',3,3',4,5-pentahydroxy diphenyl ether and the like. These aromatic compounds as the component (c), which serve to improve the adhesion between the patterned photoresist layer and the surface of a metallic substrate, can be used either singly or as a combination of two kinds or more according to need.

The weight proportion of the alkali-soluble novolac resin as the component (a) and the quinone diazide group-containing compound as the component (b) in the photosensitive resin composition should be such that the amount of the component (a) is in the range from 5 to 200 parts by weight or, preferably, from 10 to 60 parts by weight per 10 parts by weight of the component (b). When the amount of the novolac resin is too large, the fidelity of image transfer would be poor along with a decrease in the transferability. When the amount of the novolac resin is too small, on the other hand, the resist layer formed from the composition would be poor in the uniformity and the resolution of patterning would also be decreased.

The amount of the polyhydroxy aromatic compound as the component (c) in the inventive composition is in the range from 0.5 to 50 parts by weight or, preferably, from 1.0 to 40 parts by weight per 100 parts by weight of the total amount of the components (a) and (b). When the amount of the component (c) is too small, the desired effect of improvement of the adhesion between the patterned resist layer and the metallic substrate surface cannot be fully exhibited as a matter of course. On the other hand, the desired effect by the addition of this component cannot be further increased even by increasing the amount thereof to exceed the above mentioned upper limit rather with an undesirable influence that the sensitivity of the photosensitive resin composition is somewhat decreased. The optimum amount of the component (c) depends on the type of the photosensitizing ingredient.

It is optional that the photosensitive resin composition used in the method of the invention is admixed according to need with various kinds of known additives conventionally used in photosensitive resin compositions having compatibility with the essential ingredients of the composition. Examples of such optional additives include auxiliary resins, plasticizers and stabilizers to improve the properties of the resist layer, coloring agents to improve the visibility of the patterned resist layer formed by development, additional photosensitizers to further enhance the sensitivity of the composition, and so on.

The alkali-soluble, positive-working photosensitive resin composition used in the inventive method can be prepared by dissolving the above described essential components (a), (b) and (c) and optional ingredients each in a specified amount in a suitable organic solvent to form a uniform solution which is, in step (A) of the inventive method, applied to the surface of a metallic substrate such as a vapor-deposited film of tantalum on a glass plate by using a spinner or other suitable coating machines followed by drying to give a uniform resist layer.

Examples of suitable organic solvents for the purpose include ketones such as acetone, methyl ethyl ketone, cyclohexanone, methyl isoamyl ketone, methyl tert-butyl ketone and the like, polyhydric alcohols and derivative thereof such as monomethyl, monoethyl, monopropyl, monobutyl and monophenyl ethers of ethyleneglycol, ethyleneglycol monoacetate, diethyleneglycol or diethyleneglycol monoacetate and the like, cyclic ethers such as dioxane and the like and esters such as ethyl lactate, methyl acetate, ethyl acetate, butyl acetate, methyl pyruvate, ethyl pyruvate, ethyl 3-ethoxy propionate and the like. These organic solvents can be used either singly or as a mixture of two kinds or more according to need.

In step (B) of the inventive method, the resist layer formed on the surface of a metallic substrate by using the photosensitive resin composition is exposed pattern-wise through a pattern-bearing photomask with actinic rays such as ultraviolet light emitted from a low-pressure mercury lamp, high-pressure mercury lamp, ultrahigh-pressure mercury lamp, arc lamp, xenon lamp and the like to form a latent image of the pattern therein. Alternatively, the resist layer can be irradiated pattern-wise by scanning with electron beams. The thus formed latent image of the pattern can be developed, in step (C) of the inventive method, by using an alkaline developer solution such as an aqueous solution of tetramethyl ammonium hydroxide in a concentration of 1 to 10% by weight so that the resist layer on the areas pattern-wise exposed to actinic rays, which is imparted with increased solubility in the developer solution, is selectively dissolved away leaving the resist layer on the unexposed areas to form a patterned resist layer which is a high-fidelity reproduction of the pattern on the photomask. Thereafter, the surface of the metallic substrate pattern-wise exposed bare by the removal of the resist layer is subjected to etching or other necessary treatment with the patterned resist layer as the masking followed by removal of the patterned resist layer.

In the following, the method of the invention using the specific photosensitive resin composition is described in more detail by way of examples, which, however, never limit the scope of the present invention in any way. In the following examples, the patterned resist layers formed from the respective photosensitive resin compositions were evaluated for the adhesion between the patterned resist layer and the surface of the metallic substrate on which the resist layer was formed by the procedure described in Example 1. The results obtained by the electron microscopic examination of the line-wise patterned resist layer were rated in three ratings of A, B and C relative to the minimum width of the line-formed resist layer which was found to work satisfactorily as an etching resist of the tantalum film as the substrate according to the criteria of: A for a minimum width of 2 µm or smaller; B for a minimum width larger than 2 µm but not exceeding 10 µm; and C for a minimum width exceeding 10 µm. The photosensitive resin composition can be used satisfactorily in practical applications when this minimum width of the line pattern is 10 µm or smaller. In other words, the procedure using the photosensitive resin compositions is within the scope of the invention when they are rated in A or B in the above mentioned criteria for the adhesion test.

EXAMPLE 1

A positive-working photosensitive resin composition in the form of a uniform solution was prepared by dissolving, in 400 g of ethyleneglycol monoethyl ether acetate, 100 g of a cresol novolac resin having a weight-average molecular weight of about 12,000 as prepared by a conventional method from a 6:4 mixture of m- and p-cresols, 30 g of a naphthoquinone-1,2-diazide-5-sulfonic acid ester of 2,3,4,4'-tetrahydroxy benzophenone and 10 g of 2,2',3,4,4'-pentahydroxy benzophenone.

The photosensitive resin solution thus prepared was applied by using a spinner to the surface of a tantalum film vapor-deposited on a glass plate as the substrate in a coating thickness of 1.75 µm as dried to form a uniform resist layer which was subjected to a pre-baking treatment on a hot plate at 110° C. for 90 seconds and then exposed pattern-wise to ultraviolet light through a test pattern photomask on a contact-exposure machine (Model PLA-500F manufactured by Canon Co.). The thus pattern-wise exposed resist layer on the substrate was immersed in a 2.5% by weight aqueous solution of tetramethyl ammonium hydroxide at 23° C. for 100 seconds so that the resist layer on the exposed areas was dissolved away followed by a baking treatment on a hot plate at 180° C. for 5 minutes to form a line-wise patterned resist layer on the tantalum surface. The plate was then immersed in an etching solution which was a mixed solution of hydrofluoric and nitric acids (SA High-Purity Buffered Hydrofluoric Acid, a product by Hashimoto Kasei Co.) at 23° C. for 9 minutes to remove the tantalum film on the exposed areas with the patterned resist layer as the etching resist.

The patterned resist layer was evaluated for the adhesion with the tantalum surface below by the electron microscopic examination to find that the minimum width of the line-formed resist layer which worked satisfactorily as the masking was 1 μm to show excellent performance of the resin composition.

EXAMPLES 2 to 17

Comparative Examples 1 to 7

The experimental procedure in each of these examples and comparative examples was substantially the same as in Example 1 except that the 2,2',3,4,4'-pentahydroxy benzophenone used in Example 1 was replaced with the compound indicated in Table 1 in an amount also indicated in the same table. The experiment in Comparative Example 7 was carried out by merely omitting the 2,2',3,4,4'-pentahydroxy benzophenone to give a minimum line width of 30 μm. The substitute compounds for 2,2',3,4,4'-pentahydroxy benzophenone in Examples 16 and 17 were the compounds expressed by the structural formulas (II) and (III), respectively, to give the minimum line widths of 2 μm and 1.5 μm, respectively, indicating quite satisfactory adhesion of the resist layer to the substrate surface.

TABLE 1

|  | Aromatic compound | Amount added, g | Adhesion |
|---|---|---|---|
| Example | | | |
| 2 | 2,2',3,4,4'-Pentahydroxy benzophenone | 30 | A |
| 3 | 2,2',3,4,4'-Pentahydroxy benzophenone | 50 | B |
| 4 | 2,2',3,4,4',5'-Hexahydroxy benzophenone | 10 | A |
| 5 | 2,2',3,4,4',5'-Hexahydroxy benzophenone | 30 | A |
| 6 | 2,2',3,4,4',5'-Hexahydroxy benzophenone | 50 | B |
| 7 | 2-(2,3,4-trihydroxyphenyl)-2-(2',4'-dihydroxyphenyl) propane | 10 | A |
| 8 | 2-(2,3,4-trihydroxyphenyl)-2-(2',4'-dihydroxyphenyl) propane | 30 | A |
| 9 | 2,2',3,4,4'-Pentahydroxy diphenylsulfide | 10 | A |
| 10 | 2,2',3,4,4'-Pentahydroxy diphenylsulfide | 30 | A |
| 11 | 2-(2,3,4-trihydroxyphenyl)-2-(2',4',5'-trihydroxyphenyl) propane | 10 | A |
| 12 | 2-(2,3,4-trihydroxyphenyl)-2-(2',4',5'-trihydroxyphenyl) propane | 30 | A |
| 13 | 2-(2,3,4-trihydroxyphenyl)-2-(2',3',4'-trihydroxyphenyl) propane | 10 | A |
| 14 | 2,2',3,4,4',5'-Hexahydroxy diphenylsulfide | 10 | A |
| 15 | 2,2',3,4,4',5'-Hexahydroxy diphenylsulfide | 30 | A |
| 16 | Compound expressed by structural formula (II) | 10 | A |
| 17 | Compound expressed by structural formula (III) | 10 | A |
| Comparative Example | | | |
| 1 | 2,3,4-Trihydroxy benzophenone | 10 | C |
| 2 | 2-(2,3,4-trihydroxyphenyl)-2-phenyl propane | 10 | C |
| 3 | 2,3,4-Trihydroxy diphenylsulfide | 10 | C |

TABLE 1-continued

|  | Aromatic compound | Amount added, g | Adhesion |
|---|---|---|---|
| 4 | 2,2',4,4'-Tetrahydroxy benzophenone | 10 | C |
| 5 | 2-(2,4-dihydroxyphenyl)-2-(2',4'-dihydroxyphenyl) propane | 10 | C |
| 6 | 2,2',4,4'-Tetrahydroxy diphenylsulfide | 10 | C |

What is claimed is:

1. A product comprising a positive-working photosensitive resin composition as a coating layer on a substrate, of which at least the surface layer is made from tantalum, said resin composition comprising, as a uniform blend, (a) an alkali-soluble novolac resign;

(b) a quinone diazide group-containing organic compound; and (c) an aromatic compound having two benzene rings in a molecule selected from the group consisting of (c-1) the compounds represented by the general formula

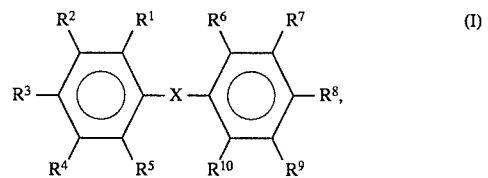

in which $R^1$ to $R^{10}$ are each, independently from the others, a hydrogen atom, alkyl group having 1 to 4 carbon atoms, alkenyl group, halogen atom, hydroxy group, alkoxy group or carboxyl group including at least five hydroxy groups and X is a divalent atom or group of the formula —CO—O—, —CO—, —S—, —SO—, —SO$_2$—, —O— or —CR$_2$—, each R being an alkyl group, (c-2) a compound expressed by the structural formula

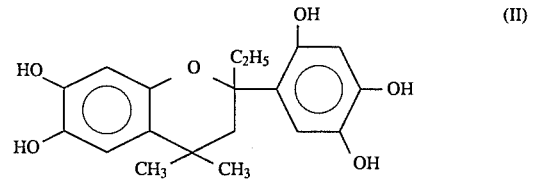

and (c-3) a compound expressed by the structural formula

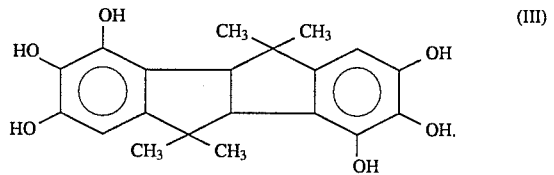

2. The product comprising a positive-working photosensitive resin composition as a coating layer on a substrate, of which at least the surface layer is made from tantalum, as claimed in claim 1, in which the amount of the component (a) in the photosensitive resin composition is in the range from 5 to 200 parts by weight per 10 parts by weight of the component (b).

3. The product comprising a positive-working photosensitive resin composition as a coating layer on a substrate, of which at least the surface layer is made from tantalum, as claimed in claim 2, in which the amount of the component (a) in the photosensitive resin composition is in the range from 10 to 60 parts by weight per 10 parts by weight of the component (b).

4. The product comprising a positive-working photosensitive resin composition as a coating layer on a substrate, of which at least the surface layer is made from tantalum, as claimed in claim 1, in which the amount of the component (c) in the photosensitive resin composition is in the range from 0.5 to 50 parts by weight per 100 parts by weight of the total amount of the components (a) and (b).

5. The product comprising a positive-working photosensitive resin composition as a coating layer on a substrate, of which at least the surface layer is made from tantalum, as claimed in claim 4, in which the amount of the component (c) in the photosensitive resin composition is in the range from 1.0 to 40 parts by weight per 100 parts by weight of the total amount of the components (a) and (b).

* * * * *